(12) United States Patent
Aoki

(10) Patent No.: US 6,546,985 B2
(45) Date of Patent: Apr. 15, 2003

(54) DIE BONDER

(75) Inventor: Toru Aoki, Shiga (JP)

(73) Assignee: NEC Machinery Corporation, Kusatsu (JP)

(*) Notice: Subject to any disclaimer, the term of this patent is extended or adjusted under 35 U.S.C. 154(b) by 0 days.

(21) Appl. No.: 09/374,847

(22) Filed: Aug. 16, 1999

(65) Prior Publication Data

US 2002/0092622 A1 Jul. 18, 2002

(30) Foreign Application Priority Data

Aug. 19, 1998 (JP) .............................. 10-232180

(51) Int. Cl.[7] .......................... H01L 21/52; H01L 21/66
(52) U.S. Cl. ...................... 156/363; 156/361; 156/351; 156/538; 29/593; 29/833
(58) Field of Search ................... 156/538, 363, 156/556, 558, 351, 356, 357, 362; 438/14, 33, 16; 29/593, 25.01, 833

(56) References Cited

U.S. PATENT DOCUMENTS

| | | | | |
|---|---|---|---|---|
| 4,543,659 A | * | 9/1985 | Ozaki | 382/8 |
| 5,549,716 A | * | 8/1996 | Takahashi et al. | 29/25.01 |
| 5,725,728 A | * | 3/1998 | Fuke et al. | 156/584 |
| 5,765,277 A | * | 6/1998 | Jin et al. | 29/743 |
| 5,851,848 A | * | 12/1998 | Balamurugan | 438/33 |
| 5,983,490 A | * | 11/1999 | Sakemi | 29/833 |

* cited by examiner

Primary Examiner—Richard Crispino
Assistant Examiner—Sue A. Purvis
(74) Attorney, Agent, or Firm—McGinn & Gibb, PLLC

(57) ABSTRACT

A die bonder, to which semiconductor pellets 4 are supplied in an arranged state, comprises a substrate feeding mechanism for feeding a substrate 1 including a plurality of pellet islands to successively set the pellet island at a bonding position BP, a defective substrate detecting means 3 for detecting defective pellet island, and a pellet transfer mechanism. The pellet transfer mechanism successively picks up and carries a defective pellet to the bonding position BP for mounting when a pellet island of the substrate set at the bonding position is non-defective, and mounts a defective pellet 4a when a pellet island is defective. In this arrangement, when the defective substrate detecting means determines that a pellet island is defective, a defective pellet is mounted.

24 Claims, 2 Drawing Sheets

DIE BONDER

BACKGROUND OF THE INVENTION

1. Field of the Invention

This invention relates to a die bonder which fabricates semiconductor devices.

2. Description of the Related Art

A semiconductor device is formed by mounting semiconductor pellets onto a base such as lead frame or substrate for BGA (Ball Grid Array) using a die bonder. Then the plurality of pellet mounting parts are arranged and performing resin molding at a subsequent step.

Conventional lead frames are made of metal plate and formed by punching, and even if a part of a lead frame is not good (no-good), a pellet is mounted on such part. In another words, a die bonder is formed on the assumption that pellets are mounted on all islands (die pads) of the lead frame.

The current need for reduction in size accelerates the transition to such as BGAs or CSPs (Chip Size Package). However, because of the complicated structures a substrate of such package might have some no-good part. It means that, even if a few no-good parts are included in the substrate, other good parts must be used from an economical viewpoint. Therefore, functions are provided to give a bad mark to the no-good part in the substrate so that the no-good part can be identified by a die bonder, to bond a pellet only to a good part without mounting a pellet on a no-good part. Normally, a wafer is divided and supplied, while the arrangement of pellets is substantially maintained, and good pellets without marks are picked up. When the pellets are bonded onto island of the substrate, the substrate is checked, and if a bad mark is found on the substrate, the marked part is passed without bonding a pellet-and the next island is fed.

However, such bonding may cause a situation in which substrates with pellet mounted and some of substrates without pellet mounted are supplied together to a subsequent step. When such substrates are processed under the same condition at the subsequent resin molding steps into each of which resins are injected, it will cause different capacities, variations in the quality of products. Moreover, the resin might leak from a part, where no pellet is provided, and the resin attaches to a mold holding a substrate and is cured. Since the cured resin cannot be easily removed, a measure is taken to avoid the problem by bonding a dummy pellet to a no-good island. For these reasons, there is a necessity of providing a die bonder which can bond no-good pellets to no-good islands and which can bond a dummy pellet to a no-good island.

SUMMARY OF THE INVENTION

It is an object of this invention to provide a die bonder which picks up and bonds a good pellet to a good pellet mounting part (called "island") of a substrate and bonds a no-good pellet to a no-good island.

To achieve the aforementioned object, this invention provides a die bonder, to which semiconductor pellets are supplied in a systematically arranged state, comprising a substrate feeding mechanism including a plurality of islands to position the island, a no-good detecting means to detect no-good island, and a pellet transfer mechanism, which picks up and carries a good pellet to a bonding position when an island in bonding position is good, and mounts a no-good pellet when an island is no-good. As described above, when the no-good detecting means judges that an island is no-good, then a no-good pellet is mounted.

In the die bonder of the present invention, semiconductor pellets including no-good pellets are supplied in an arranged state. The die bonder comprises a substrate feeding mechanism for feeding a substrate including a plurality of islands to position the islands at a bonding position, a no-good detecting means for detecting no-good island and a pellet transfer mechanism. The pellet transfer mechanism may be formed to pick up and carry a good pellet to a bonding position in the order of the arrangement of semiconductor pellets, leaving no-good pellets unpicked when a island at the bonding position is good. And when a island is judged as no-good one, the mechanism picks up, carries, and mounts one of no-good pellets. Conventionally, pellets are arranged on a wafer and carried to the die bonder so that no-good pellets are also carried to the bonder. In this bonder, it is not required to separately prepare no-good pellets.

Further, the die bonder, to which semiconductor pellets are supplied including no-good ones in an arranged state, may comprise a substrate feeding mechanism including a plurality of islands to successively set the islands at bonding position, a no-good detecting means for detecting no-good island, a stocker for stocking a plurality of no-good pellets, and a pellet carrying mechanism. When an island set at a bonding position is no-good, then the bonder picks up and carries a good pellet to the bonding position for mounting in the order of the pellet layout. When a no-good pellet is detected, the bonder picks up and carries the no-good pellet into the stocker if the stocker is not occupied, or leaves the pellet unpicked if the stocker is occupied. And if an island is no-good, the bonder picks up and carries a no-good pellet from the stocker to the bonding position for mounting. This allows the supplied pellets to be picked up in the order of the arrangement, and hence the bonder is not complicated, simplifying the software of the bonder. No-good pellets can be immediately picked up since they are stocked in the stocker.

The die bonder of the invention is to bond semiconductor pellets to a substrate or base material such as a lead frame or a substrate for CSP having a plurality of pellet mounting parts (called "island"). The substrate may include a no-good island. The die bonder includes a substrate feeding mechanism for carrying the substrate in such a manner that the islands are successively set at a predetermined bonding position, in a manner similar to a conventional die bonder.

Since the substrate may have no-good islands, a detecting means for detecting no-good island is provided to prevent expensive good pellets from being mounted onto a land. As the no-good detecting means, an image processing device including a camera which is disposed at the bonding position or before the bonding position and which takes an image near the island or another sensor may be used to check defects by the on-the-spot observation, or similar means or simpler means may be used to check a mark (bad mark) assigned to a no-good island at a test beforehand.

The pellets are supplied in an arranged state to the die bonder of the present invention. In many aspects, the arrangement of the pellets is maintained on a wafer and hence the pellets are supplied, including no-good pellets. However, a die bonder can basically select only good pellets and put on a chip tray in an arranged state. This kind of die bonder may be employed to supply defective pellets, being put on a similar chip tray, to bond them to no-good islands, while good pellets are picked up from the chip tray and bonded to good island.

On the other hand, in the die bonder of the type in which pellets are supplied, together with no-good pellets, there are two methods to bond the pellets to good islands, as follows. In a first method, good pellets are picked up and carried to a bonding position in the order of the pellets arrangement, leaving a no-good pellet unpicked. And if no-good island is set at the bonding position, the carrying order is changed to pick up the no-good pellet to mount it onto the no-good island. So if a good island is set at the bonding position, a good pellet is picked up and bonded. This method can be employed without the necessity of changing devices. However, when the substrate has many no-good island and a wafer having few no-good pellets is supplied, the bonder may have to be stopped since no-good pellets are all picked up from preceding wafers and can not be used.

In a second method, a stocker for stocking no-good pellets is provided. If a good island is set at a bonding position, a good pellet is picked up and bonded in the order of the arrangement of pellets. If a no-good pellet is detected, it is picked up and carried into a space of the stocker, if available, and if not available, it is left without being picked up. If a no-good island is set at the bonding position, a no-good pellet in the stocker is picked up and bonded. The stocker is provided for stocking no-good pellets to prevent the lack thereof. The stocker may be made for free movement to pick up or receive no-good pellets at a required position, or the stocker may be fixed and a pellet transfer mechanism is made for free movement in XY directions. According to this method, since the semiconductor pellets can be picked up in order, a pickup operation can be performed at a higher speed.

In any of the aforementioned methods, a pellet transfer mechanism is provided. The pellet transfer mechanism picks up and carries a supplied pellet to bond it to a island of a substrate positioned at a bonding position, and picks up, carries, and puts a no-good pellet into a stocker, and picks up and carries a no-good pellet stored in the stocker or in a chip tray to a island positioned at the bonding position. As the pellet transfer mechanism, a pick-and-place mechanism which utilizes vacuum suction is often used. The aforementioned carrying operations may be performed by a single pick-and-place mechanism, or each or some of the operations may be performed by a separate pick-and-place mechanism. In addition, a series of operations of picking up, carrying, and bonding pellets supplied to the islands may be carried out by a first pick-and-place mechanism which picks up and temporarily places pellets at a relay point, where after accurate positioning is made, and a second pick-and-place mechanism picks up, carries, and bonds the pellets to a island. The pellet transfer mechanism described in the specification is composed of all of such mechanisms.

For picking up the supplied semiconductor pellets, a method may be used, in which a wafer stage (carrier stage if the pellets are supplied in a chip carrier) on which pellets are arranged, is provided to be movable in XY directions to set pellets to be picked up at a predetermined pickup position and a pellet transfer mechanism performs a pickup operation at a fixed point. Alternatively, a method may be used, in which the semiconductor pellets are fixed and the pellet carrying mechanism moves in XY directions to pick up the pellets.

For separating good pellets from no-good pellets when the pellets comprising good and no-good ones are supplied, a method can be applied. For example, each of the no-good pellets is assigned a mark (bad mark) in a wafer stage, and the bonder is provided with a detecting means including an image processing device such as a camera for photographing a pellet to check a mark and the external appearance of pellet. Alternatively, there is another method in which pellets are supplied where a wafer is divided into individual pellets substantially maintaining the original arrangement and a map data showing no-good and good pellets in a wafer stage is provided for the die bonder. Then defective pellets can be identified by using the map data only.

When a no-good pellet stocker is not provided and pellets including no-good pellets are supplied and if a good island is set at a bonding position, the good pellet is picked up, and carried to the bonding position, leaving the no-good pellet. And, if a no-good island is set at the bonding position, a no-good pellet must be picked up and bonded. In the method for detecting no-good pellets based on a map data, a no-good pellet can be taken up using the map data. On the other hand, in the method for detecting no-good pellet by providing the no-good pellet detecting means to check a mark on the spot, search is performed to find no-good pellet, in which the positions of the pellets previously left unpicked are preferably memorized.

DESCRIPTION OF THE PREFERRED EMBODIMENTS

Figure 1A:
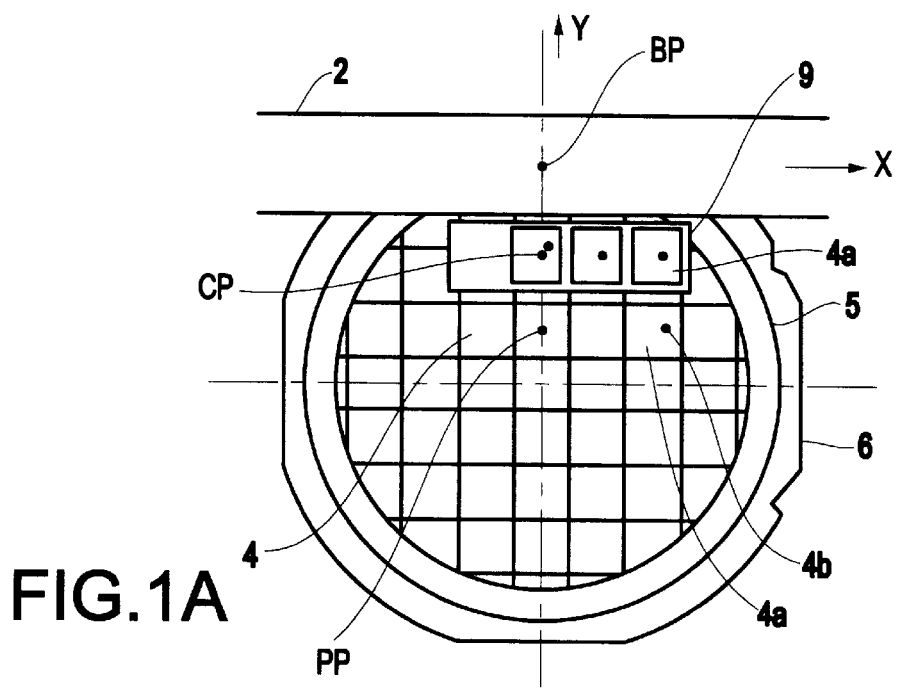
FIG. 1(A) is a plan view conceptually showing an embodiment of the present invention.
Figure 1B:
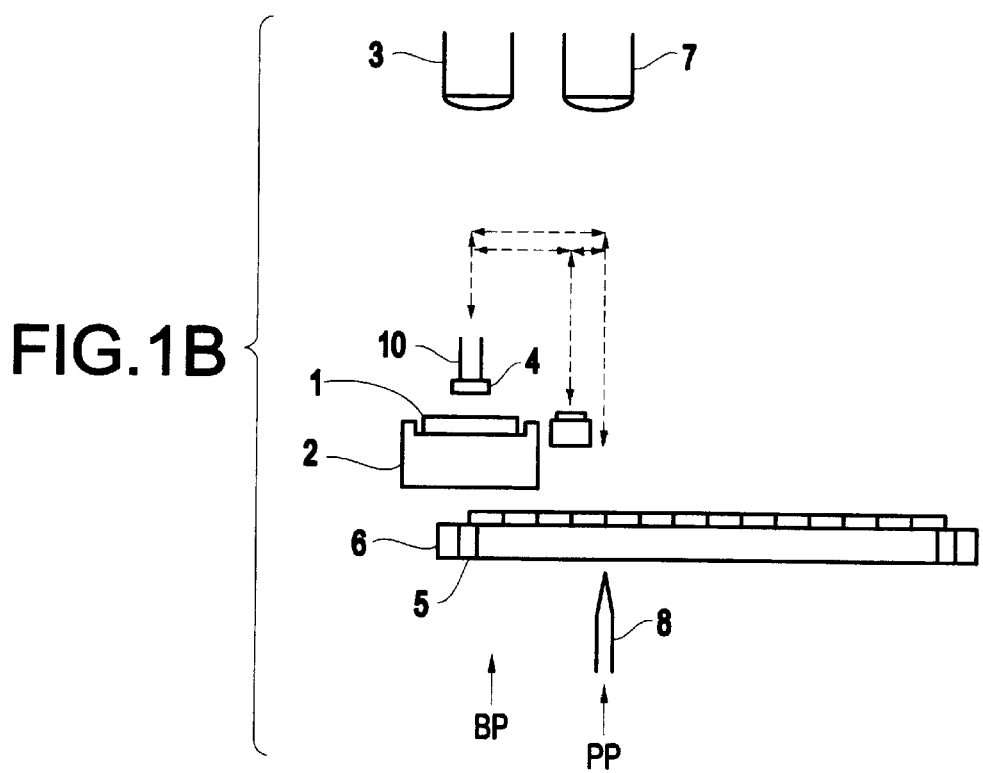
FIG. 1(B) is a side view showing the embodiment of the present invention in FIG. 1(A)

An embodiment of the invention will be hereinafter described with reference to the drawings. FIG. 1(A) is a plan view conceptually showing the embodiment and FIG. 1(B) is a side view thereof. A die bonder shown in FIG. 1(A) and FIG. 1(B) includes rail 2 for carrying a base such as substrate 1 from the left to the right in FIG. 1(A). Substrate 1 comprises a plurality of pellet mounting parts (hereinafter referred to as "islands", not shown) at a predetermined pitch. Substrate 1 also comprises a substrate feeding mechanism (not shown) which intermittently feeds substrate 1 in accordance with the pitch of the island to successively locate it at bonding position BP. Camera 3, which is an image processing device serving as a defective substrate detecting means for detecting no-good islands, is disposed above bonding position BP or a island stop position before bonding position BP.

Semiconductor pellets 4 are supplied to the die bonder in such a manner that they are arranged on a wafer and inspected to put a bad mark 4b on each of defective pellets 4a. Then the pellets are affixed to a tape (not shown), with the original arrangement thereof being substantially maintained, and held in wafer ring 5. Therefore, semiconductor pellets 4 are supplied in a systematically arranged manner, including no-good pellets 4a. The bonder has ring-shaped wafer stage 6 to hold therein supplied wafer ring 5 so that wafer ring 5 is freely moved in XY directions to locate semiconductor pellet 4 at a pickup position PP. And wafer stage 6 freely rotates (θ direction) about the center thereof to adjust its orientation.

Pickup position PP is set at a point not so far from bonding position BP in Y direction. Above pickup position PP is provided camera 7 which is an image processing device serving as a defective pellet detecting means for checking the pellet 4 disposed at pickup position PP and checking the presence or absence of bad mark or the presence of abnormal appearance such as cracks. Under the pickup position PP is disposed push pin 8 so as to be movable vertically to push up pellet 4 from below to allow it to be peeled off from the tape (not shown).

Stocker 9 is disposed between bonding position BP and pickup position PP to stock no-good pellets 4a. Stocker 9 includes pellet accommodating parts which are disposed in a row, spaced apart at regular intervals in X direction, to store a plurality of defective pellets. Stocker 9 is movable in X direction so that the center of stored no-good pellet 4a is located at a carry-over position CP on a line connecting bonding position BP and pickup position PP.

The bonder includes a pellet transfer mechanism (not shown). The pellet carrying mechanism includes sucking nozzle 10 movable in Y direction and Z direction (vertical direction) with its end extending downward. Sucking nozzle 10 sucks up and carries good pellet 4 located at pickup position PP to bonding position BP, no-good pellet 4a located at pickup position PP to carry-over position CP, and no-good pellet at carry-over position CP to bonding position BP, respectively, in a U-shaped operation.

Next, the constitution of the bonder will be described in further detail in conjunction with the operation thereof.

(1) Prior to the starting of die bonder, stocker 9 is fully filled with no-good pellets 4a or filled with proper number of no-good pellets. This is performed by picking up no-good pellets 4a each marked with bad mark 4b from supplied pellets 4 held in wafer ring 5 to put them into stocker 9. The pellets 4a are put into stocker 9, manually or automatically. Storing positions, at each of which no-good pellet 4a is placed, are memorized, and thereafter present storage positions are always memorized corresponding to storage and removal of the pellets 4a.

(2) When substrate 1 is sent by a substrate transfer mechanism (not shown) to locate and stop a island thereof (not shown) at bonding position BP, camera 3 takes an image near the island to perform image processing, thereby determining whether or not the island is defective.

(3) If it is a good island, wafer stage 6 moves in XY directions in accordance with the layout of semiconductor pellet 4 to locate semiconductor pellet 4 at pickup position PP. Camera 7 takes an image to check the position and quality of pellet 4. If it is a good pellet, wafer stage 6 is smoothly aligned in XYθ directions based on the checked positional data and also the position is checked (repeatedly as required), thereby completing the alignment. The sucking nozzle of pellet transfer mechanism then sucks up and carries good pellet 4 to the island waiting at bonding position BP for bonding.

(4) When the pellet located at pickup position PP is determined as no-good, an unoccupied space in stocker 9, if any, is located at carry-over position CP and alignment is made in a manner similar to the case of non-good pellet. Sucking nozzle 10 sucks up, picks up, and carries the no-good pellet to the pellet storing part of stocker 9 located at carry-over position CP. If stocker 9 has no space, the no-good pellet is not picked up and wafer stage 6 moves to position a succeeding pellet 4 at pickup position PP. Such operation is repeated to position good pellet, whereby the pellet is picked up and bonded. In case of no-good pellet, the pellet is left unpicked and a succeeding pellet is positioned at pickup position PP to carry out alignment, picking up, and bonding.

(5) When the substrate is fed and a island set at bonding position BP is defective, a storing part in stocker 9, where no-good pellet 4a is placed, is set at carry-over position CP, and sucking nozzle 10 picks up and carries no-good pellet 4a to the no-good island which is waiting at bonding position BP.

According to the embodiment, a no-good pellet is automatically bonded onto a no-good island on substrate 1. Additionally, stocker 9 is provided to stock a no-good pellet every time it is generated so that the bonder is prevented from being stopped due to the lack of no-good pellets, and hence the need having to provide no-good pellets can be eliminated, with the result that bonding operation can be performed at a high speed.

Figure 2A:
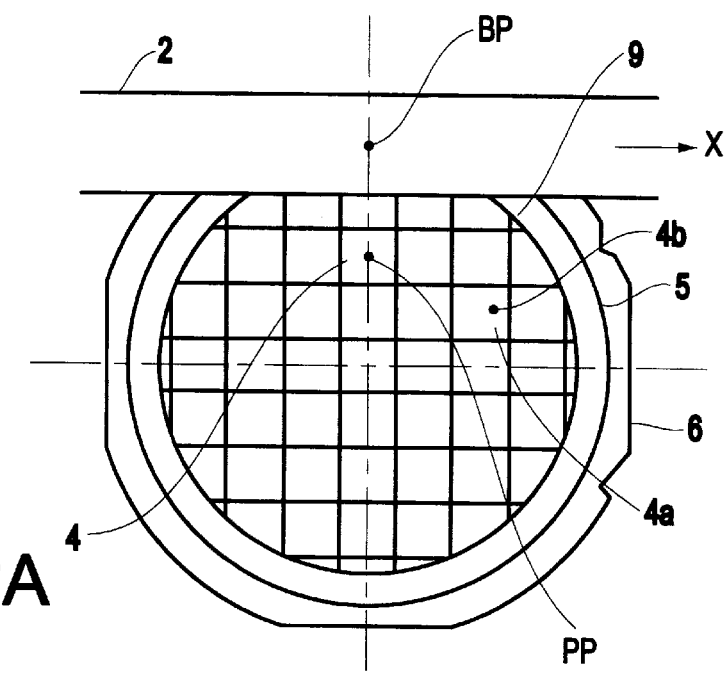
FIG. 2(A) is a plan view conceptually showing a second embodiment of the present invention.
Figure 2B:
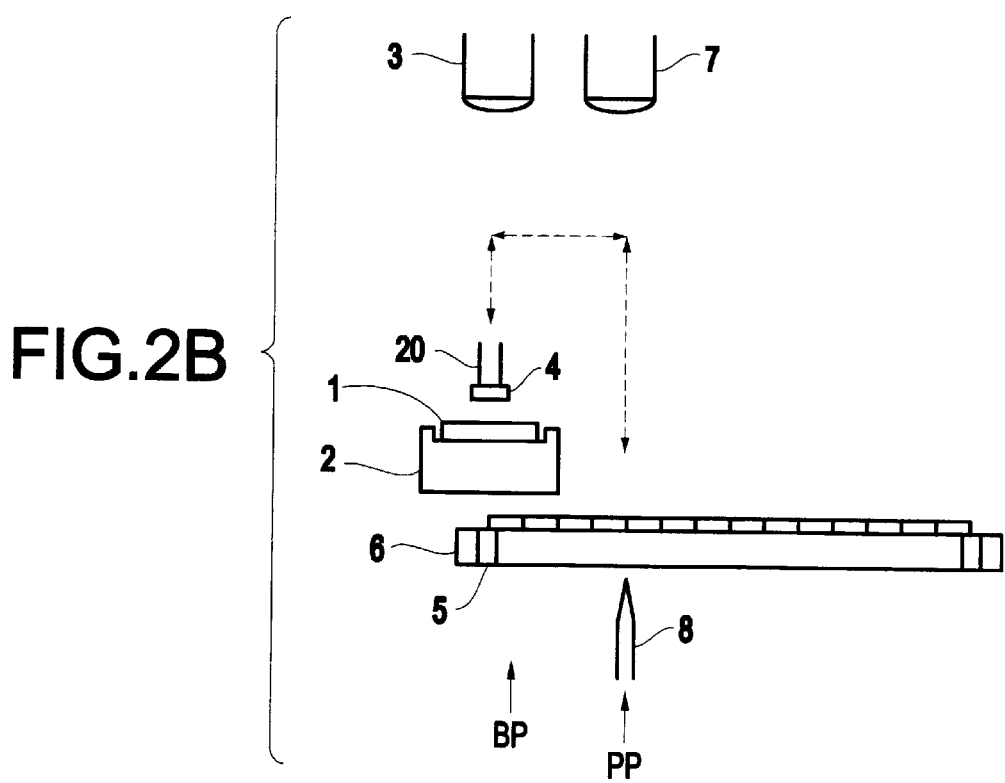
FIG. 2(B) is a side view showing the second embodiment of the present invention in FIG. 2(A).

A second embodiment of the invention is described as follows; FIG. 2(A) is a plan view conceptually showing the embodiment and FIG. 2(B) is a side view thereof. Semiconductor pellets 4 are fed to the die bonder in such a manner that pellets 4 containing defective ones 4a each marked with bad mark 4b are affixed to a tape, in an arranged state, and are held in wafer ring 5, as described in the first embodiment. This die bonder of this embodiment also includes rail 2 for carrying substrate 1, a substrate feeding mechanism, bonding position BP, and camera 3 serving as an image processing device, similarly to the first embodiment. The die bonder also includes wafer stage 6, pickup position PP, camera 7, serving as an image processing device, disposed above pickup position PP, and push pin 8 disposed below pickup position PP. However, since this bonder does not include a stocker, which is provided in the first embodiment, pickup position PP is set at a position closer to bonding position BP.

Sucking nozzle 20 of a pellet transfer mechanism sucks up and carries pellet 4 positioned at pickup position PP to bonding position BP in a U-shaped manner.

As described above, this bonder has the same construction as a prior art. However, there are differences in the process. That is, supplied semiconductor pellets 4 are successively positioned at pickup position PP in accordance with the layout thereof, and no-good pellets are detected by an image processing device including camera 7 to pick up good pellets, leaving no-good pellets unpicked. And storage means (memory means) is provided to store the locations of the unpicked no-good pellets. When the no-good pellet whose position is stored in the means is picked up, when required, the stored position is erased to always store only the positions of the unpicked no-good pellets. Therefore, the storage is cleared when a bonding operation is completed and a succeeding wafer ring is supplied.

And a no-good pellet search program is provided for driving wafer stage 6 and an image processing device including camera 7 to bring no-good pellet 4a with bad mark 4b to pickup position PP if a no-good pellet is needed, when no no-good pellet is stored in the aforementioned storage means.

Next is the constitution of the embodiment described in detail together with the operation.

(1) When substrate 1 is sent by a substrate transfer mechanism to locate an island at bonding position BP, camera 3 takes an image near the land to perform image processing, thereby determining whether or not the island is defective.

(2) If it is a good island, wafer stage 6 moves in XY directions in accordance with the layout of pellets 4 to locate pellet 4 at pickup point PP. Camera 7 takes an image to check the position of pellet 4 and to determine whether or not the pellet is defective. If defective, the positional data thereof is stored in the storage means except for the case of abnormal appearance such as fractures or chips. No-good pellets 4a, including those having abnormal appearance, are left unpicked and wafer stage 6 locates succeeding semiconductor pellet 4 at pickup point PP. Camera 7 takes an image to check the position of pellet 4 and to determine whether or not the pellet is defective. If good, wafer stage 6 is finely aligned in XYθ directions based on the checked positional data and thereafter the position is checked (repeatedly as required) to complete alignment. Sucking nozzle 20 of the pellet transfer device then sucks up good pellet 4 to the island which is waiting at bonding position BP.

(3) When the substrate is fed and an island thereof disposed at bonding position BP is no-good, and if data of a no-good pellet has been stored in the storage means, wafer stage 6 is moved in XY directions to locate the no-good pellet on pickup position PP based on the data. Thereafter, alignment is made similarly to the good pellet, and sucking nozzle 20 picks up and carries no-good pellet 4a to the no-good island for bonding. When data of a no-good pellet is not stored in the storage means, succeeding pellets are set at pickup position PP to check the quality of the pellet until a no-good pellet bearing bad mark 4b is detected, whereby no-good pellet is bonded. In either case, the succeeding picking up is resumed at a position where the proceeding picking up has been performed.

According to the embodiment, a no-good pellet is automatically bonded on a no-good island of substrate 1. Additionally, since a conventional device can be used with no change in structure but only the device of this embodiment can be provided by modifying only software, and hence equipment cost can be reduced as compared with the first embodiment.

As described above, according to the invention, since a no-good pellet is automatically mounted on a no-good pellet island, variations in the quality of products can be reduced.

Although the preferred embodiments of the invention have been described in detail, it should be understood that various changes, substitutions and alternations can be made therein without departing from spirit and scope of the inventions as defined by the appended claims.

What is claimed is:

1. A die bonder to which semiconductor pellets are supplied in an arranged state, comprising:
   a substrate feeding mechanism for feeding a substrate including a plurality of islands to successively set the pellet islands at a bonding position;
   a defective substrate detecting device for detecting defective islands;
   an image processing device adapted to scan and detect a defective pellet; and
   a pellet transfer mechanism configured to successively pick up and transfer a good pellet, scanned for defects, to the bonding position to mount the good pellet when an island set at the bonding position is good, and mount said scanned defective pellet when an island is defective.

2. The die bonder according to claim 1, further comprising:
   a memory device configured to store a location of a plurality of unpicked defective pellets.

3. The die bonder according to claim 2, wherein the memory device is further configured to erase a location of an defective pellet when said defective pellet is picked.

4. The die bonder according to claim 3, wherein the memory device is further configured to clear all locations when a new set of pellets is supplied to the die bonder.

5. The die bonder according to claim 3, further comprising:
   an image processing device including a camera configured to identify defective pellets and communicate a location associated with a defective pellet to the memory device.

6. The die bonder to which semiconductor pellets are supplied in an arranged state according to claim 1, wherein said defective substrate detecting device comprises an image processing device.

7. The die bonder to which semiconductor pellets are supplied in an arranged state according to claim 1, wherein said defective substrate detecting device comprises a camera.

8. The die bonder to which semiconductor pellets are supplied in an arranged state according to claim 1, wherein said image processing device comprises a camera.

9. The die bonder to which semiconductor pellets are supplied in an arranged state according to claim 1, further comprising:
   an adhesive applied to said island when mounting said pellet to said island.

10. A die bonder to which semiconductor pellets, including defective pellets, are supplied in an arranged state, comprising:
    a substrate feeding mechanism for feeding a substrate including a plurality of islands to successively set the islands at a bonding position;
    a defective substrate detecting device for detecting defective islands;
    an image processing device adapted to scan and detect a defective pellet; and
    a pellet transfer mechanism configured to pick up and transfer a good pellet, scanned for defects, to the bonding position to mount the pellet in the order of pellets, leaving said defective pellet unpicked when a pellet island set at the bonding position is good, and pick up, transfer, and mount said scanned defective pellet when a pellet island is defective.

11. The die bonder according to claim 10, further comprising a wafer stage carrying thereon supplied pellets and freely moving in XY directions to set the pellets at a pickup position,
    wherein said wafer stage sets a good pellet at the pickup position in the order of the pellet arrangement, leaving a defective pellet unpicked, when a pellet island set at the bonding position is good, and sets a defective pellet of the pellets carried by the wafer stage at the pickup position when a pellet island is defective, and the pellet transfer mechanism picks up and carries the pellets to the bonding position for mounting.

12. The die bonder according to claim 11, wherein a defective pellet is given a mark, the die bonder further comprising a defective pellet detecting device for detecting a defective pellet by sensing the presence of the mark,
    wherein said wafer stage positions a good pellet at the pickup position in the order of the arrangement of the pellets, leaving a defective pellet unpicked when a pellet island set at the bonding position is good, and searches the arranged pellets to set a defective pellet at the pickup position when a pellet island is defective, and said pellet transfer mechanism picks up and carries the pellets to the bonding position for mounting.

13. The die bonder according to claim 11, wherein setting a no-good pellet at the pickup position, when a pellet island is no-good, is performed by setting the no-good pellet left unpicked previously at the pickup position based on the positional data stored.

14. The die bonder according to claim 10, wherein a defective pellet is given a mark, said die bonder further comprising a defective pellet detecting device for checking defective pellet by sensing the presence of the mark, wherein said pellet transfer mechanism picks up and carries a good pellet to the bonding position to mount the pellet in the order of the arrangement of the pellets, leaving a defective pellet unpicked when a pellet island set at the bonding position is good, and when a pellet island is defective, said defective pellet detecting device searches the supplied pellets to find a defective pellet and said pellet transfer mechanism picks up and carries the defective pellet to the bonding position for mounting.

15. The die bonder according to claim 10, wherein the pellets are supplied in a manner in which a wafer is divided so that individually divided pellets are maintained substantially in the same arrangement as the original arrangement, no-good/good map data is provided for each pellet at a wafer stage, and the pellet transfer mechanism picks up and carries a good pellet to the bonding position for mounting in the order of the pellets arrangement, leaving a no-good pellet unpicked, based on the map data when a pellet island set at the bonding position is good, and picks up and carries a no-good pellet out of the supplied pellets for mounting based on the map data when a pellet island is no-good.

16. The die bonder according to claim 15, further comprising a wafer stage carrying thereon supplied pellets and freely moving in XY directions to set the pellets at a pickup position, wherein said wafer stage sets a good pellet at the pickup position in the order of the pellets arrangement, leaving a no-good pellet unpicked, based on the map data when a pellet island set at the bonding position is good, and positions a no-good pellet at the pickup position based on the map data when a pellet island is no-good, and the pellet transfer mechanism picks up and carries the pellets to the bonding position for mounting.

17. A die bonder to which semiconductor pellets, including defective pellets, are supplied in an arranged state, comprising:

a substrate feeding mechanism for feeding a substrate including a plurality of pellet islands to successively locate the pellet islands at a bonding position;

a defective substrate detecting device for detecting a defective pellet island;

an image processing device adapted to scan and detect a defective pellet;

a stocker for stocking a plurality of defective pellets; and a pellet transfer mechanism configured such that when a pellet island set at the bonding position is good, said pellet transfer mechanism picks up and carries a good pellet, scanned for defects, to the bonding position for mounting in the order of the pellets arrangement, and when said defective pellet is detected, picks up and carries the defective pellet to an unoccupied space if said stocker has such a space, and leaves the defective pellet unpicked if said stocker has no space, and when a pellet island is defective, picks up and carries said scanned defective pellet to the bonding position for mounting.

18. The die bonder according to claim 17, further comprising a wafer stage carrying thereon supplied pellets and freely moving in XY directions to set the pellets at a pickup position, wherein when a pellet island set at the bonding position is good, said wafer stage sets a good pellet at the pickup position in the order of the pellet arrangement and said pellet transfer mechanism carries the good pellet to the pellet island set at the bonding position for mounting, and when a no-good pellet is detected, said wafer stage sets the no-good pellet at the pickup position and said pellet transfer mechanism carries the no-good pellet to stocker if said stocker has an unoccupied space, and said pellet transfer mechanism carries a no-good pellet from said stocker to the bonding position for mounting when a pellet island is no-good.

19. The die bonder according to claim 18, wherein a defective pellet is given a mark, said die bonder further comprising a defective pellet detecting device for detecting a defective pellet by sensing the presence of the mark, wherein when a pellet island set at the bonding position is good, the wafer stage sets a good pellet detected by the defective pellet detecting means at the pickup position in the order of the arrangement of the semiconductor pellets and the pellet transfer mechanism carries the good pellet to the bonding position for mounting, and when a defective pellet is detected, the wafer stage sets the defective pellet at the pickup position and the pellet transfer mechanism carries the defective pellet to the stocker if said stocker has an unoccupied space, and leaves the defective pellet unpicked if said stocker has no spacer, and said pellet transfer mechanism picks up and carries a defective pellet from the stocker to the bonding position for mounting when a pellet island is defective.

20. The die bonder according to claim 17, wherein a defective pellet is given a mark, said die bonder further comprising a defective pellet detecting device for detecting a defective pellet by sensing the presence of the mark, wherein when a pellet island set at the bonding position is good, said pellet transfer mechanism picks up and carries the good pellet detected by said defective pellet detecting device to the pellet island of the substrate set at the bonding position to mount the pellet in the order of the pellets arrangement, and when a defective pellet is detected, said pellet transfer mechanism picks up and carries the defective pellets to an unoccupied space if the stocker has such a space and leaves the defective pellet unpicked if said stocker has no space, and said pellet transfer mechanism picks up and carries a defective pellet from the stocker to the bonding position for mounting when a pellet island is defective.

21. A die bonder wherein semiconductor pellets, including defective pellets, are supplied in such a manner that a wafer is divided so that individually divided pellets are maintained substantially in the same arrangement as the original arrangement and map data for defective and good pellets are provided in a wafer stage, said die bonder, comprising:

a substrate feeding mechanism for feeding a substrate including a plurality of pellet island to successively set the pellet island at a bonding position;

a defective substrate detecting device for detecting defective pellet islands;

an image processing device adapted to scan and detect a defective pellet;

a stocker for stocking a plurality of defective pellets; and a pellet transfer mechanism configured such that when a pellet island set at the bonding position is good, said pellet transfer mechanism picks up and carries a good pellet, scanned for defects, to a pellet island for mounting in the order of the pellets arrangement based on the map data, and when said defective pellet is detected, picks up and carries the defective pellet into an unoccupied space if said stocker has such a space, and leaves the defective pellet unpicked if said stocker has no space, and said pellet transfer mechanism picks up and carries said scanned defective pellet from said stocker to the pellet island for mounting when a pellet island is defective.

22. The die bonder according to claim 21, further comprising a wafer stage carrying thereon supplied pellets and freely moving in XY directions to set the pellets at a pickup position, wherein when a pellet island set at the bonding position is good, a wafer stage sets a good pellet at the pickup position in the order of the pellet arrangement based on the map data and said pellet transfer mechanism picks up and carries the good pellet to the bonding position for mounting, and when a no-good pellet is detected, the wafer stage sets the no-good pellet at the pickup position and said pellet transfer mechanism picks up and carries the no-good pellet to the stocker if said stocker has an unoccupied space and leaves the no-good pellet unpicked if said stocker has no space, and when a pellet island is no-good, said pellet transfer mechanism picks up and carries the no-good pellet from said stocker to the bonding position for mounting.

23. A die bonder to which semiconductor pellets are supplied in a state, comprising:

a substrate feeding mechanism for feeding a substrate including a plurality of islands to successively set the pellet island at a bonding position, a defective substrate detecting device for detecting defective islands, a defective pellet detecting device for detecting defective pellets in order to prevent said defective pellet from being used on a non-defective island of a substrate, and a pellet transfer mechanism configured to successively pick up and transfer a good pellet, previously scanned for defects, to the bonding position to mount the good pellet when an island set at the bonding position is good, and mount a previously scanned defective pellet when an island is defective.

24. The die bonder to which semiconductor pellets are supplied in an arranged state according to claim 23, wherein said defective pellet detecting device comprises an image processing device.

* * * * *